US008593854B1

(12) United States Patent
Chih et al.

(10) Patent No.: US 8,593,854 B1
(45) Date of Patent: Nov. 26, 2013

(54) STRUCTURE AND METHOD FOR FORMING CONDUCTIVE PATH IN RESISTIVE RANDOM-ACCESS MEMORY DEVICE

(75) Inventors: Yue-Der Chih, Hsin-Chu (TW); Luan Conn Tran, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 13/476,366

(22) Filed: May 21, 2012

(51) Int. Cl.
*G11C 11/00* (2006.01)
(52) U.S. Cl.
USPC .............................. 365/148; 365/158; 365/163
(58) Field of Classification Search
USPC ......................................................... 365/100
See application file for complete search history.

(56) References Cited

U.S. PATENT DOCUMENTS

| 7,324,366 | B2 * | 1/2008 | Bednorz et al. | 365/148 |
| 7,859,882 | B2 * | 12/2010 | Cho et al. | 365/148 |
| 8,238,149 | B2 * | 8/2012 | Shih et al. | 365/163 |

* cited by examiner

*Primary Examiner* — Tan T. Nguyen
(74) *Attorney, Agent, or Firm* — Duane Morris LLP

(57) ABSTRACT

An array and forming method for resistive-RAM (RRAM) devices provides for the simultaneous selection of multiple bit cells and the simultaneous forming of the RRAM resistive elements within the selected bit cells. The bit cells each include a resistive element and a transistor and are arranged vertically along vertical bit lines. The resistive elements of the bit cells are coupled to source lines that are parallel to word lines and perpendicular to the vertical bit lines. The bit lines are maintained at different biases. A high voltage is applied to one of the source lines coupled to adjacent resistive elements of bit cells disposed along more than one vertical bit line. When the associated transistors are turned on by a sufficiently high gate voltage, the desired RRAM resistive elements along one of the bit lines are formed without stressing other bit cells of the array.

20 Claims, 1 Drawing Sheet

STRUCTURE AND METHOD FOR FORMING CONDUCTIVE PATH IN RESISTIVE RANDOM-ACCESS MEMORY DEVICE

TECHNICAL FIELD

The disclosure relates to semiconductor devices and, more particularly, to resistive random-access memory (RRAM) device layouts and methods for forming conductive paths to activate the RRAM devices.

BACKGROUND

Integrated circuits that serve as memory devices or include memory portions are very popular and serve a variety of functions in the electronics world. Resistive random-access memory (RRAM) devices are non-volatile memory type devices formed using semiconductor manufacturing methods. RRAM technology bears some similarities to conductive-bridging RAM (CBRAM) and phase change memory devices.

RRAM devices operate under the principle that a dielectric, which is normally insulating, can be made to conduct through a filament or conduction path formed after the application of a sufficiently high voltage. The conduction path formation can arise from different mechanisms, including defect, metal migration, and other mechanisms. Various different dielectric materials may be used in RRAM devices. Once the filament or conduction path is formed, it may be reset, i.e. broken, resulting in high resistance or set, i.e. re-formed, resulting in lower resistance, by an appropriately applied voltage.

Memory devices are commonly formed using a layout that includes a repeating array of bit cells. One challenge applicable to the formation of an array of RRAM devices is how to manufacture the array using a minimal number of common processing operations. Another challenge applicable to the formation and forming of RRAM devices is how to layout the memory cells and apply a sufficiently high voltage that forms the filament or conduction path in the selected bit cell without adversely affecting the semiconductor devices such as select transistors or other transistors associated with the memory cell.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
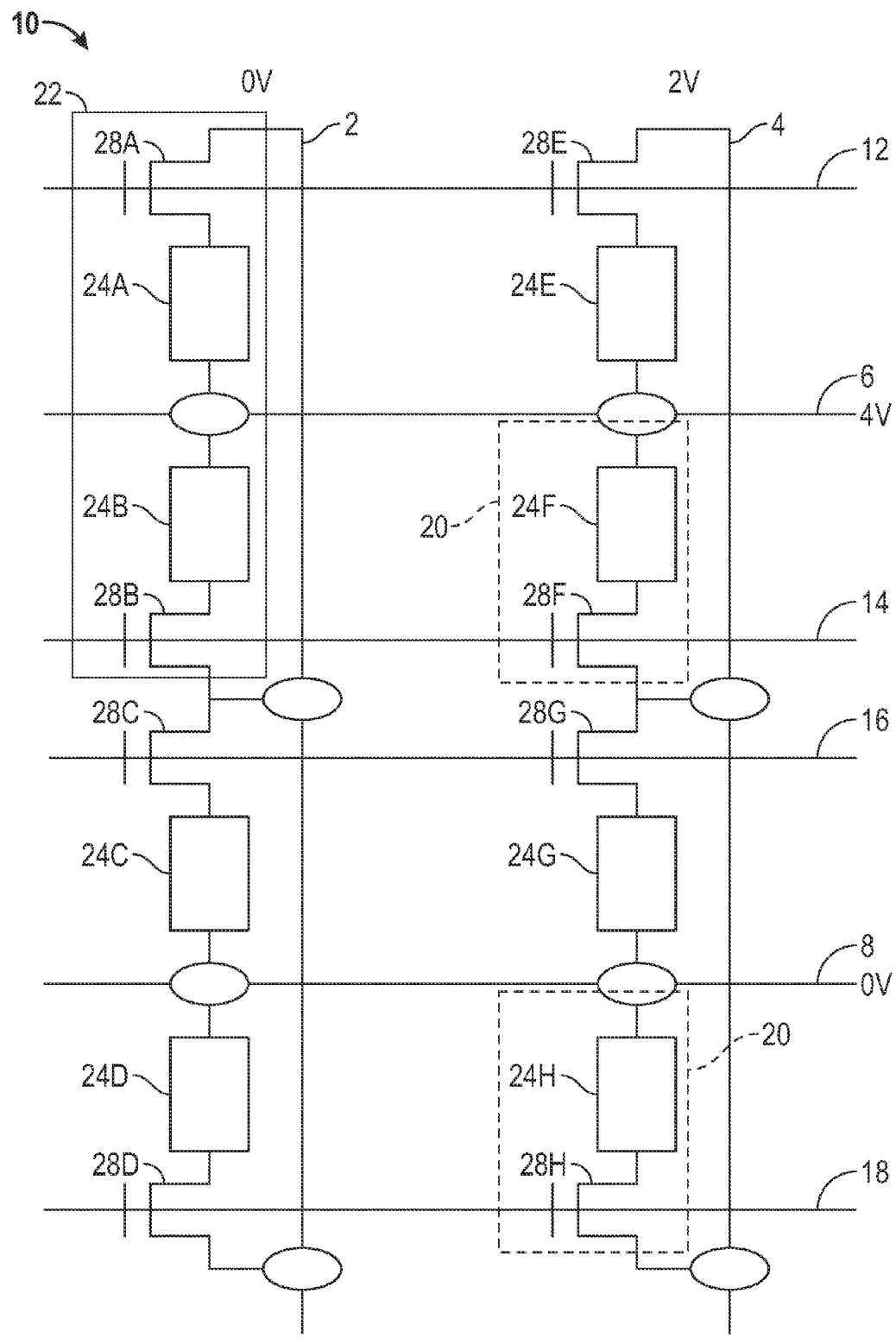
FIG. 1 is an exemplary layout of an RRAM array according to the disclosure.

Provided is an array structure of resistive random-access memory (RRAM) devices. More particularly, provided is a memory array of bit cells including RRAM devices. The array architecture and the wiring allow for forming two selected memory devices simultaneously. By "forming", it is meant that a filament or conduction path is initialized or created in a resistive element. In one embodiment, the resistive element is in a bit cell. Once the filament or conduction path is formed, the memory cell may be set or reset. The reset procedure includes breaking the filament or conduction path thereby restoring the resistive element to high resistance and the set procedure includes re-forming the filament or conduction path within the resistive element, resulting in low resistance. The set and reset operations are carried out using appropriately applied voltage.

The disclosure provides an array that includes bit lines in one direction and word lines and source lines in a direction orthogonal to the direction of the bit lines. Although the bit lines are drawn as vertical lines in FIG. 1 and described as such, and although the word lines and parallel source lines are drawn as horizontal lines in FIG. 1 and described as such, such is for ease of description only and refers to the orientation described in FIG. 1 only.

The memory cell layout shown in FIG. 1 represents a section of a larger memory array. In one embodiment, the larger memory array including the memory cell layout shown in FIG. 1 is a memory device and in another embodiment, the larger memory array including the memory cell layout shown in FIG. 1 is a memory section of another semiconductor device. The components and structures shown in FIG. 1 are formed using operations that simultaneously form other components and structures throughout the semiconductor device which may be an integrated circuit or other device.

The layout embodiment illustrated in FIG. 1 provides the advantage that the select transistors included in the bit cells can be formed using the same process operations used to form other transistors in the semiconductor device. A thicker gate oxide is not required in the select transistors to sustain the forming voltage applied to form, i.e. initialize or create a conductive filament inside the memory cell. The layout design also enables the application of the forming voltage to form multiple RRAM devices on one bit line without blowing out transistors or stressing other components such as other bit cells, on the other bit lines. The bit lines are maintained at different biases, in some embodiments.

FIG. 1 shows an embodiment of an array structure according to the disclosure. Bit lines 2 and 4 extend in the vertical direction. Source lines 6 and 8 extend in the horizontal direction, perpendicular to bit lines 2 and 4 and word lines 12, 14, 16, 18 which are parallel to source lines 6, 8, extend in the horizontal direction and are perpendicular to bit lines 2, 4.

In the illustrated embodiment, each bit cell 20 is a 1T1R bit cell that includes one transistor and one resistive element. In other embodiments, the bit cells are 2T2R bit cells, or 6T6R or 8T8R bit cells or other suitable bit cells. In the illustrated embodiment, the resistive elements are identified as resistive elements 24A-24H and the transistors are identified as transistors 28A-28H. Each bit cell includes one resistive element 24A-24H and one associated transistor 28A-28H in the illustrated embodiment. Within each bit cell, the transistor 28A-28H includes a gate coupled to one of the word lines 12, 14, 16, 18. The associated transistor 28A-28H includes one of its source/drain coupled to a bit line, 2, 4 and the other of its source/drain coupled to one terminal of the associated resistive element 24A-24H. The opposed terminal of each resistive element 24A-28H is coupled to one of the source lines 6, 8.

In one embodiment, transistors 28A-28H are formed identically, i.e., transistor 28A-28H are simultaneously manufactured using the same process operations and include substantially the same dimensions and materials of construction. According to this embodiment, transistors 28A-28H operate using the same threshold voltage and other electric characteristics. In other embodiments, transistors 28A-28H may differ from one another. In one embodiment, resistive elements 24A-24H are formed using the same set of process operations and are substantially identical to one another, and include the same operating conditions. In another embodiment, resistive elements 24A-24H may differ from one another.

The resistive elements include various structures in various embodiments. In one embodiment, the resistive elements 24A-24H includes a sandwich structure with a dielectric disposed between opposed conductive plates. In one embodiment, the resistive element 24A-24H includes a MIM (metal-insulator-metal) capacitor. Other resistive structures are used in other embodiments. When a sufficiently high bias is applied across the opposed terminals of the selected resistive element 24A-24H, the resistive element is "formed", i.e., a filament or conductive path is produced across the resistive element. The associated transistor 28A-28H serves as a select transistor which is turned on to select the associated resistive element 24A-24H to be formed.

One embodiment of an array with applied voltages for simultaneously forming two adjacent resistive elements in a bit cell of an RRAM device, is shown in FIG. 1 which also includes some applied voltages. Bit lines 2, 4 are maintained at different biases (0V, 2V, respectively) in the illustrated embodiment. It should be understood that the applied voltages represent just one embodiment and that other voltages and other relative voltages are used in other embodiments. Threshold voltages for transistors 28A-28H and forming voltages for resistive elements 24A-24H are determined by their respective structures which vary in various embodiments. When a resistive element (24A-24H) is desired to be formed, a voltage greater than the forming voltage is applied across its terminals. In the illustrated embodiment, it is desired to form the resistive elements 24A, 24B in selected portion 22. Resistive elements 24A, 24B each have one terminal coupled to source line 6 which includes a 4 volt bias in the illustrated embodiment. The opposite terminal of resistive element 24A is coupled to one source/drain of transistor 28A and the opposite terminal of resistive element 24B is coupled to a source/drain of transistor 28B. The opposite source/drain of each of transistor 28A and 28B is coupled to bit line 2 which is maintained at ground, i.e., zero volts in the illustrated embodiment.

In one embodiment, a bias of 4 volts is applied to source line 6 and a bias of 0 volts is applied to source line 8. In other embodiments, other biases are used. A bias of 4 volts is thereby applied to one of the opposed terminals of each of resistive elements 24A and 24B. A bias of 4 volts is therefore applied across the bit cell that includes transistor 28A and resistive element 24A and also across the bit cell that includes resistive element 24B and transistor 28B, thereby stressing each of the described bit cells. The bit cells to be formed are then selected by applying a voltage greater than a gate voltage to the gates of the desired transistors.

In the illustrated embodiment, selected portion 22 includes two bit cells that include transistors 28A and 28B. A voltage that exceeds the threshold voltage of the transistors is applied to word lines 12 and 14. In one embodiment, the applied voltage greater than the threshold voltage of the transistor, is 2 volts but other applied voltages are used in other embodiments. Note that word lines 16 and 18 are maintained at a bias of 0 volts, i.e., ground. Transistors 28A and 28B are thereby "turned on", i.e., activated, resulting in a voltage of 4 volts across each of adjacent resistive elements 24A, 24B. This voltage of 4 volts is sufficient to form, i.e. create or initialize a conductive filament inside the resistive elements 24A and 24B and is referred to as the forming voltage. It should be noted that other forming voltages are used in other embodiments. The application of a sufficient forming voltage, 4 volts in the illustrated embodiment, to source line 6 simultaneously forms adjacent resistive elements 24A and 24B when transistors 28A and 28B are turned on. A filament or other conductive path is created across the resistive element 24A, 24B thereby forming the resistive element. The RRAM devices form non-volatile memory cells and thereby retain data when power is turned off. The formed resistive elements may be set or reset later by applying appropriate voltages.

With source line 8 maintained at zero volts, neither resistive elements 24C, 24D nor the resistive elements in the associated bit cells disposed along bit line 4, are under stress nor do they become formed. The 1T1R bit cell including resistive element 24A and transistor 28A and the 1T1R bit cell including resistive element 24B and transistor 28B are each stressed by having four volts applied across the cell prior to being formed by activating the associated transistors 28A and 28B. When transistors 28A and 28B are turned on by applying a sufficient gate voltage to word lines 12 and 14, transistors 28E and 28F are also turned on as their respective gates are also coupled to word lines 12 and 14, respectively, according to the embodiment in which all transistors 28A-28G are substantially identical and include the same threshold voltage. Bit line 4 is maintained at 2 volts and therefore the voltage applied across the bit cells including resistive elements 24E and 24F, is 2 volts. As such, these bit cells are not overly stressed. Therefore when transistors 28E and 28F are activated, and with a bias of 4 volts applied to source line 6, a voltage of only 2 volts is applied across each of resistive elements 24E and 24F in the illustrated embodiment. The application of only 2 volts across resistive elements 24E and 28F is insufficient to form these resistive elements according to various embodiments. It should again be noted that although the resistive elements 24A-24H are formed using a voltage of 4 volts and are not formed when a voltage of 2 volts is applied across their terminals, these voltages vary in other embodiments. The array arrangement illustrates how two resistive elements 24A and 24B in selected portion 22 are formed by application of gate voltages to word lines 12 and 14 without stressing or forming other bit cells. Transistors 28G and 28H of bit cells formed along bit line 4, are not activated as the voltage applied to word lines 16, 18 is zero volts and therefore not greater than the threshold voltage of these transistors. In the novel array arrangement of the disclosure, the bit cells that include transistors 28G and 28H are not under severe stress because the voltage across the bit cell is 2 volts, not 4 volts, because one of the opposed terminals of the bit cell, one of the source drains of transistor 28G, is held at 2 volts while the opposite terminal of the bit cell, i.e., the opposite terminal of resistive element 24G, is held at zero volts.

In this manner, the array provides for simultaneously forming adjacent resistive elements by applying a sufficiently high forming voltage which does not form or stress other bit cells of the array thereby preventing leakage across unselected cells or other damage to the devices in the array.

According to one aspect, a resistive random-access memory (RRAM) device is provided. The RRAM device comprises a plurality of bit cells, each including a transistor and resistive element. The bit cells are arranged in a vertical column, each bit cell having a transistor having one source/drain coupled to a vertical bit line and the other source/drain coupled to a first terminal of the resistive element. The RRAM device also comprises a plurality of word lines coupled to respective gates of the transistors and arranged in a horizontal direction; and a plurality of source lines arranged in the horizontal direction and each coupled to an opposed terminal of at least one of the resistive elements, wherein a first source line of the source lines is coupled to two adjacent bit cells of the plurality of bit cells and biased at a sufficiently high voltage to enable the resistive elements of the two adjacent bit cells to have a conductive path formed therein, the two adjacent bit cells disposed along a first vertical bit line.

According to another aspect, a method for forming a RRAM device is provided. The method comprises providing a plurality of bit cells, each including a transistor and resistive element, the bit cells arranged in a vertical column, each bit cell having the transistor having one source/drain coupled to a vertical bit line and the other source/drain coupled to a first terminal of the resistive element; providing a plurality of word lines coupled to respective gates of the transistors and arranged in a horizontal direction; providing a plurality of source lines arranged in the horizontal direction and each coupled to an opposed terminal of at least one of the resistive elements; and forming conductive paths in associated resistive elements of two adjacent bit cells of the plurality of bit cells disposed along a first vertical bit line at least by biasing a first source line of the source lines to produce a sufficiently high voltage across the associated resistive elements.

According to another aspect, another method for forming a RRAM device is provided. The method comprises providing a plurality of bit cells, each including a transistor and resistive element, the bit cells arranged in vertical columns, each bit cell having a transistor having one source/drain coupled to a vertical bit line of a plurality of vertical bit lines and the other source/drain coupled to a first terminal of the resistive element; providing a plurality of word lines coupled to respective gates of the transistors and arranged in a horizontal direction; providing a plurality of source lines arranged in the horizontal direction and including a first source line coupled to opposed ends of adjacent resistive elements of the resistive elements in at least a first vertical bit line and a second vertical bit line of the plurality of vertical bit lines; and biasing the first source line to produce a sufficiently high voltage across the associated resistive elements such that conductive paths are formed in the associated resistive elements of two adjacent bit cells along the first vertical bit line but not in the associated resistive elements of two further adjacent bit cells along the second vertical bit line.

The preceding merely illustrates the principles of the disclosure. It will thus be appreciated that one of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by one of ordinary skill in the art without departing from the scope and range of equivalents of the disclosure.

What is claimed is:

1. A resistive random-access memory (RRAM) device comprising:
   a plurality of bit cells, each including a transistor and resistive element, said bit cells arranged in vertical columns, each said bit cell having said transistor having one source/drain coupled to a vertical bit line and the other source/drain coupled to a first terminal of said resistive element;
   a plurality of word lines coupled to respective gates of said transistors and arranged in a horizontal direction; and
   a plurality of source lines arranged in said horizontal direction and each coupled to an opposed terminal of at least one of said resistive elements,
   wherein a first source line of said source lines is coupled to two adjacent bit cells of said plurality of bit cells and biased at a sufficiently high voltage to enable said resistive elements of said two adjacent bit cells to have a conductive path formed therein, said two adjacent bit cells disposed along a first vertical bit line.

2. The RRAM device as in claim 1, wherein each said bit cell comprises a 1T1R bit cell.

3. The RRAM device as in claim 1, wherein said first source line includes a biased of at least 4 volts.

4. The RRAM device as in claim 1, wherein two word lines of said plurality of word lines are each coupled to a respective gate of a respective one of said transistors of said adjacent bit cells, and are biased at a gate voltage greater than a threshold voltage of said transistors.

5. The RRAM device as in claim 4, wherein said gate voltage is about 2 volts.

6. The RRAM device as in claim 1, wherein said first vertical bit line is at ground and there is a bias of at least 4 volts across said resistive elements of said two adjacent bit cells along said first vertical bit line.

7. The RRAM device as in claim 6, further comprising a second vertical bit line having a non-zero bias and wherein said first source line is coupled to said resistive elements of further adjacent bit cells of said plurality of bit cells, said further adjacent bit cells disposed along said second vertical bit line, and
   wherein conductive paths are not formed in said resistive elements of said further adjacent bit cells.

8. A method for forming a resistive random-access memory (RRAM) device, said method comprising:
   providing a plurality of bit cells, each including a transistor and resistive element, said bit cells arranged in vertical columns, each said bit cell having said transistor having one source/drain coupled to a vertical bit line and the other source/drain coupled to a first terminal of said resistive element;

providing a plurality of word lines coupled to respective gates of said transistors and arranged in a horizontal direction;

providing a plurality of source lines arranged in said horizontal direction and each coupled to an opposed terminal of at least one of said resistive elements; and forming conductive paths in said resistive elements of two adjacent bit cells of said plurality of bit cells, disposed along a first vertical bit line at least by biasing a first source line of said source lines to produce a sufficiently high voltage across each said associated resistive elements.

9. The method as in claim 8, wherein said sufficiently high voltage comprises a voltage of at least 4 volts.

10. The method as in claim 8, wherein said forming conductive paths further comprises turning on said associated transistors in said adjacent bit cells.

11. The method as in claim 8, wherein said forming conductive paths further comprises applying a voltage greater than a threshold voltage to two word lines of said plurality of word lines coupled to gates of said associated transistors in said adjacent bit cells.

12. The method as in claim 11, wherein said first vertical bit line is maintained at ground.

13. The method as in claim 12, wherein said two word lines are further coupled to two further adjacent bit cells of said plurality of bit cells disposed along a second vertical bit line;
said second vertical bit line is not maintained at ground, and
said biasing said first source line does not form conductive paths in said associated resistive elements of said two further adjacent bit cells.

14. The method as in claim 8, wherein said forming conductive paths takes place simultaneously and each of said transistors includes substantially the same threshold voltage.

15. The method as in claim 8, wherein said first vertical bit line is maintained at ground.

16. The method as in claim 8, wherein said forming conductive paths in said associated resistive elements of said two adjacent bit cells takes place simultaneously and each said bit cell comprises a 1T1R bit cell.

17. A method for forming a resistive random-access memory (RRAM) device, said method comprising:
providing a plurality of bit cells, each including a transistor and resistive element, said bit cells arranged in vertical columns, each said bit cell having said transistor having one source/drain coupled to a vertical bit line of a plurality of vertical bit lines and the other source/drain coupled to a first terminal of said resistive element;

providing a plurality of word lines coupled to respective gates of said transistors and arranged in a horizontal direction;

providing a plurality of source lines arranged in said horizontal direction and including a first source line coupled to opposed ends of adjacent resistive elements of said resistive elements in adjacent bit cells of said plurality of bit cells disposed along a first vertical bit line and further coupled to opposed ends of further adjacent resistive elements of said resistive elements in further adjacent bit cells of said plurality of bit cells disposed along a second vertical bit line of said plurality of vertical bit lines;

biasing said first source line to apply a forming voltage to a terminal of each of said adjacent resistive elements and each of said further adjacent resistive elements; and forming conductive paths in said adjacent resistive elements but not in said further adjacent resistive elements by applying a voltage greater than a threshold voltage to two word lines of said plurality of word lines coupled to gates of said transistors in said adjacent bit cells and said further adjacent bit cells.

18. The method as in claim 17, wherein said first vertical bit line is maintained at ground.

19. The method as in claim 18, wherein said forming voltage comprises a voltage of at least 4 volts and each of said transistors includes substantially the same threshold voltage.

20. The method as in claim 18, wherein said second vertical bit line is maintained at a non-ground bias.

* * * * *